US012619153B2

(12) United States Patent
Hatmaker

(10) Patent No.: US 12,619,153 B2
(45) Date of Patent: May 5, 2026

(54) THERMAL PROCESSOR AND METHOD FOR USING THE SAME

(71) Applicant: MacDermid Graphics Solutions, LLC, Waterbury, CT (US)

(72) Inventor: Tyler Hatmaker, Dallas, GA (US)

(73) Assignee: MacDermid Graphics Solutions, LLC, Waterbury, CT (US)

( * ) Notice: Subject to any disclaimer, the term of this patent is extended or adjusted under 35 U.S.C. 154(b) by 2 days.

(21) Appl. No.: 18/739,411

(22) Filed: Jun. 11, 2024

(65) Prior Publication Data

US 2025/0377599 A1      Dec. 11, 2025

(51) Int. Cl.
*G03F 7/36*          (2006.01)
*B41C 1/18*          (2006.01)

(52) U.S. Cl.
CPC . *G03F 7/36* (2013.01); *B41C 1/18* (2013.01)

(58) Field of Classification Search
CPC ........................................................ G03F 7/36
See application file for complete search history.

(56) References Cited

U.S. PATENT DOCUMENTS

| | | | |
|---|---|---|---|
| 3,264,103 | A | 8/1966 | Bernard et al. |
| 5,175,072 | A | 12/1992 | Martens |
| 5,262,275 | A | 11/1993 | Fan |
| 5,279,697 | A | 1/1994 | Peterson et al. |
| 5,925,500 | A | 7/1999 | Yang et al. |
| 6,238,837 | B1 | 5/2001 | Fan |

| | | | |
|---|---|---|---|
| 6,605,410 | B2 | 8/2003 | Yang et al. |
| 7,044,055 | B2 | 5/2006 | Gotsick et al. |
| 7,358,026 | B2 | 4/2008 | Dudek et al. |
| 7,422,840 | B2 | 9/2008 | Dudek et al. |
| 7,491,003 | B2 | 2/2009 | Hackler et al. |
| 7,503,258 | B2 | 3/2009 | McMillen et al. |
| 8,198,012 | B2 | 6/2012 | Zwadlo et al. |
| 8,359,975 | B2 | 1/2013 | McMillen et al. |

(Continued)

FOREIGN PATENT DOCUMENTS

| | | | | | |
|---|---|---|---|---|---|
| EP | 4506761 A2 | * | 2/2025 | ............... | B41N 1/16 |
| WO | 2001018604 A2 | | 3/2001 | | |

*Primary Examiner* — Chanceity N Robinson
(74) *Attorney, Agent, or Firm* — Carmody Torrance Sandak & Hennessey LLP

(57) ABSTRACT

A thermal development apparatus for forming a relief structure on a photosensitive printing element. The apparatus comprises conveying means upon which the photosensitive printing element is securable, (b) a heatable roller mounted in the enclosure, wherein the heatable roller is heated to and maintained at an operating temperature at which the uncured portions of photosensitive material begins to liquefy or soften; (c) an absorbent material covering at least a portion of the heatable roller that is capable of absorbing liquefied or softened uncured portions of photosensitive material from the photosensitive printing element when the photosensitive printing element comes into contact with the absorbent material on the portion of the heatable roller; and (d) an auxiliary heating zone arranged relative to the conveying means that is configured to heat the photosensitive printing element from a first temperature at a location at which the photosensitive printing element enters or re-enters the thermal development apparatus to the operating temperature of the heatable roller.

21 Claims, 4 Drawing Sheets

(56) References Cited

U.S. PATENT DOCUMENTS

| 8,464,637 | B2 | 6/2013 | Hackler et al. |
|---|---|---|---|
| 8,492,073 | B2 | 7/2013 | Armstrong et al. |
| 8,573,120 | B1 | 11/2013 | Hackler et al. |
| 8,800,446 | B2 | 8/2014 | Luetke et al. |
| 8,895,228 | B2 | 11/2014 | Arnold et al. |
| 8,899,148 | B2 | 12/2014 | Rudolph |
| 8,920,692 | B2 | 12/2014 | Landry-Coltrain et al. |
| 8,985,020 | B2 | 3/2015 | Arnold et al. |
| 9,032,877 | B2 | 5/2015 | Arnold |
| 9,057,958 | B2 | 6/2015 | Armstrong et al. |
| 9,069,252 | B2 | 6/2015 | Schieffer, Jr. et al. |
| 9,069,255 | B2 | 6/2015 | Hennessy et al. |
| 9,291,906 | B2 | 3/2016 | Arnold |
| 9,671,695 | B2 | 6/2017 | Fronczkiewicz et al. |
| 9,889,640 | B2 | 2/2018 | Boyksen |
| 10,112,381 | B2 | 10/2018 | Schadebrodt et al. |
| 10,175,580 | B2 | 1/2019 | Fronczkiewicz et al. |
| 11,718,085 | B2 | 8/2023 | Fronczkiewicz et al. |
| 2003/0180655 | A1 | 9/2003 | Fan et al. |
| 2003/0211423 | A1 | 11/2003 | Mengel et al. |
| 2007/0084368 | A1* | 4/2007 | Vest ...................... G03F 7/202 |
| | | | 101/395 |

* cited by examiner

THERMAL PROCESSOR AND METHOD FOR USING THE SAME

FIELD OF THE INVENTION

The present invention is directed to a thermal development apparatus and a method of using the same to thermally develop photosensitive relief image printing elements.

BACKGROUND OF THE INVENTION

Flexography is a method of printing that is commonly used for high-volume runs and is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the case with which they can be made. Although photopolymer printing elements are typically used in "flat" sheet form, there are applications that utilize the printing element in a continuous cylindrical form, as a continuous in-the-round (CITR) photopolymer sleeve.

A typical flexographic printing blank as delivered by its manufacturer is a multilayered article made of, in order, a backing or support layer, one or more unexposed photosensitive or photocurable layers, a protective layer, slip film and/or laser ablatable layer, and a cover sheet.

The flexographic relief image printing element is generally produced from a photosensitive printing blank by imaging the photosensitive printing blank to produce a relief image on the surface of the photosensitive printing element. This can be accomplished by selectively exposing the photosensitive material to actinic radiation, which exposure acts to harden or crosslink the photosensitive material in the irradiated areas. The photosensitive printing blank contains one or more layers of uncured photosensitive material on a suitable backing layer. The photosensitive printing blank can be in the form of a flat, planar plate that is mounted on a carrier sleeve or a continuous (seamless) sleeve.

The photosensitive relief image printing element may be selectively exposed to actinic radiation in one of three related ways. In a first alternative, a photographic negative with transparent areas and substantially opaque areas is used to selectively block the transmission of actinic radiation to the printing element. In a second alternative, the photopolymer layer is coated with an actinic radiation (substantially) opaque layer that is sensitive to laser ablation. A laser is then used to ablate selected areas of the actinic radiation opaque layer creating an in situ negative. This technique is well-known in the art, and is described for example in U.S. Pat. Nos. 5,262,275 and 6,238,837 to Fan, and in U.S. Pat. No. 5,925,500 to Yang et al., the subject matter of each of which is herein incorporated by reference in its entirety. In a third alternative, a focused beam of actinic radiation is used to selectively expose the photopolymer. Any of these methods is acceptable, with the criteria being the ability to selectively expose one or more layers of photosensitive material to actinic radiation thereby selectively curing portions of the one or more layers of photosensitive material.

Thereafter, the one more layers of photosensitive material are developed to remove uncured (i.e., non-crosslinked) portions of the one or more layers, without disturbing the cured portions of the one or more layers of photocurable or photosensitive material, to produce the relief image. The development step can be accomplished in a variety of ways, including water washing, solvent washing, and thermal development.

Upon completion of the development step, the relief image printing element may be subjected to one or additional steps, including, for example, post-exposure to further actinic radiation and/or detackification, and is then cooled and is ready to use.

BACKGROUND OF THE INVENTION

It is an object of the present invention to improve quality of photosensitive printing elements processed using thermal development.

It is another object of the present invention to reducing machine processing issues in a thermal development apparatus that can adversely affect the quality of the photosensitive relief image printing elements processed therein.

It is still another object of the present invention to improve temperature control during thermal development.

It is another object of the present invention to reduce temperature variations of the photosensitive printing element during thermal development.

It is still another object of the present invention to control the temperature of the photosensitive printing element at entry or reentry of the photosensitive printing element into the thermal development apparatus.

It is another object of the present invention to provide a means of gradually heating the photosensitive printing element so that the temperature of the photosensitive printing element approaches the processing temperature of the thermal development apparatus.

To that end, in one embodiment, the present invention relates generally to a thermal development apparatus for forming a relief structure on a photosensitive printing element, wherein the photosensitive printing element comprises a flexible substrate and at least one layer of photosensitive material comprising cured portions of photosensitive material and uncured portions of photosensitive material on the flexible substrate, the apparatus comprising:

a) an enclosure;

b) conveying means upon which the photosensitive printing element is securable, wherein the conveying means comprises a conveyor supported by at least a first roller and a second roller, wherein the first roller is arranged adjacent to a position at which the photosensitive printing element is brought into contact with a web of absorbent material and the second roller is positioned at a distance from the first roller;

c) a heatable roller mounted in the enclosure, wherein the heatable roller is heated to and maintained at an operating temperature at which the uncured portions of photosensitive material begins to liquefy or soften;

d) an absorbent material covering at least a portion of the heatable roller, wherein the absorbent material is capable of absorbing liquefied or softened uncured portions of photosensitive material from the photosensitive printing element when the photosensitive printing element comes into contact with the absorbent material on the portion of the heatable roller; and e) an auxiliary heating zone arranged relative to the conveying means, wherein the auxiliary heating zone is configured to heat the photosensitive printing element from a first temperature at a location at which the photosensitive printing element enters or re-enters the thermal development apparatus to the operating temperature of the heatable roller.

The present invention also relates generally to a method of thermally developing photosensitive relief image printing elements using the apparatus described herein.

BRIEF DESCRIPTION OF THE FIGURES

For a fuller understanding of the invention, reference is made to the following description taken in connection with the accompanying figures in which.

Also, while all elements may not be labeled in each figure, all elements with the same reference number indicate similar or identical parts.

DETAILED DESCRIPTION OF THE PREFERRED EMBODIMENTS

Figure 1:
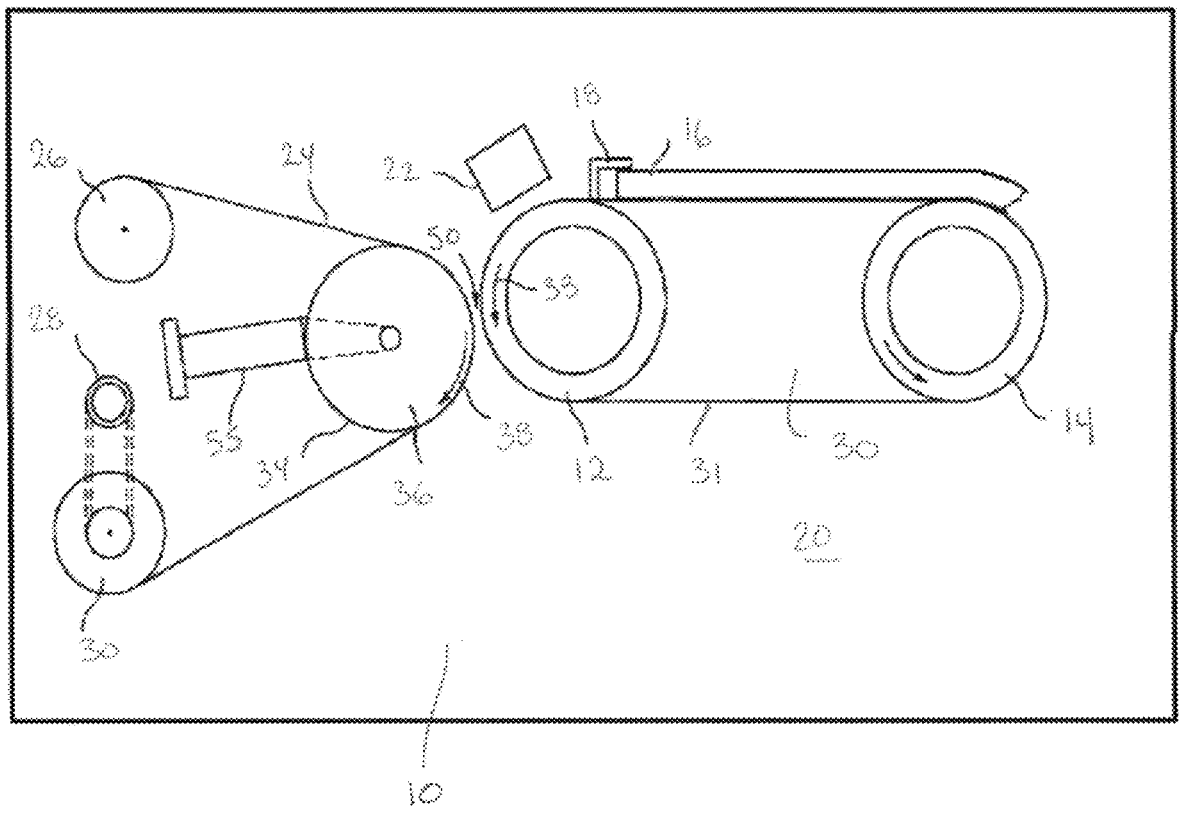
FIG. 1 depicts a thermal development apparatus in accordance with one aspect of the present invention.

The present invention relates to an improved thermal development apparatus and an improved method of using the apparatus to remove non-crosslinked polymer from an imaged and exposed surface of a relief image printing element during a process for manufacturing the flexographic relief image printing element.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, "a," "an," and "the" refer to both singular and plural referents unless the context clearly dictates otherwise.

As used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform herein. Furthermore, it is also to be understood that the value to which the modifier "about" refers is itself specifically disclosed herein.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein the term "substantially-free" or "essentially-free" if not otherwise defined herein for a particular element or compound means that a given element or compound is not detectable by ordinary analytical means that are well known to those skilled in the art of metal plating for bath analysis. Such methods typically include atomic absorption spectrometry, titration, UV-Vis analysis, secondary ion mass spectrometry, and other commonly available analytically methods.

During thermal development, an imagewise exposed photosensitive printing element is developed using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. US2003/0180655 and US2003/0211423, and in WO01/88615, WO01/18604, and EP1239329, the teachings of each of which are incorporated herein by reference in their entirety. As described herein, a photosensitive printing blank containing one or more layers of photosensitive material is selectively exposed to actinic radiation, resulting in portions of the one or more layers of photosensitive material being crosslinked and cured while other portions of the one or more layers of photosensitive material remain uncrosslinked and uncured, which uncured portions may be removed during the development step to reveal to relief image.

In order for the photosensitive printing element to be thermally developable, the composition of the one or more layers of photosensitive material must be such that there exists a substantial difference in the melt temperature between the cured and uncured photosensitive material. It is precisely this difference that allows the creation of an image in the one or more layers of photosensitive material when heated. The uncured photosensitive material (i.e., the portions of the one or more layers of photosensitive material not contacted with actinic radiation) melts and/or substantially softens while the cured photosensitive material remains solid and intact at the temperature chosen. Thus, the difference in melt temperature allows the uncured photosensitive material to be selectively removed, thereby creating the desired image.

Thereafter, uncured photosensitive material can be softened and/or melted and subsequently removed. In most instances, the heated printing element is contacted with an absorbent material that absorbs or otherwise removes the softened and/or melted uncured photosensitive material. This removal process is generally referred to as "blotting."

FIG. 1 depicts a typical thermal development apparatus 10 for developing a relief image on a photosensitive printing element 16. The thermal development apparatus 10 comprises an enclosure 20 for housing the elements of the thermal development apparatus 10.

The thermal development apparatus 10 accepts a previously formed and imagewise actinic radiation exposed photosensitive printing element 16. In one embodiment, the photosensitive printing element may be backed with a resilient compressible layer (not shown) as described, for example in U.S. Pat. No. 9,069,255 to Hennessey et al., the subject matter of which is herein incorporated by reference in its entirety. The photosensitive printing element 16 typically includes a flexible substrate (i.e., backing layer) and at least one layer of photosensitive material comprising cured portions of photosensitive material and uncured portions of photosensitive material disposed on the flexible substrate. In addition, in an in situ mask, formed from an infrared sensitive layer, may be disposed on the at least one layer of photosensitive material, which in situ mask is formed during the imagewise exposure step prior to development and which is also removable during thermal development. Examples of suitable photosensitive printing elements are described in U.S. Pat. No. 5,175,072 to Martens, U.S. Pat. Nos. 5,262,275 and 6,238,837 to Fan, and U.S. Pat. Nos. 5,925,500 and 6,605,410 to Yang et al., the subject matter of each of which is herein incorporated by reference in its entirety.

Prior to thermal development, a portion of the at least one layer of photosensitive material may be cured by actinic radiation through the lower surface of the flexible substrate to form a cured "floor" that sets the depth of plate relief. Next, the film is imagewise exposed to actinic radiation from the opposite surface to cure the desired portions of the at least one layer of photosensitive material, preferably through the in situ mask. Thus, after curing, the at least one layer of photosensitive material comprises cured portions and uncured portions, and the uncured portions must be removed during the development step.

A conveyor 30 attached to a drive motor (not shown) is used to transport and convey the photosensitive printing element 16 through the thermal plate processing system. The conveyor 30 is mounted in a fixed position in the enclosure 20, and comprises a continuous loop support means 31 supported by at least a first roller 12 and a second roller 14. Optionally, one or more additional rollers (not shown) may be used to provide additional support to the conveyor 30 and prevent the continuous loop 31 from sagging from the weight of the photosensitive printing element 16. The continuous loop support means 31 may comprise a wire mesh. Alternatively, the support means may be a rotatable drum.

The photosensitive printing element 16 is generally held in place against the continuous loop 31 of the conveyor 30 by fastening means, which fastening means may comprise a clamp 18 that secures a leading edge of the photosensitive printing element 16. The photosensitive printing element 16 may also be held in place by vacuum (not shown). The vacuum may be provided through the wire mesh of the continuous loop support means 31 and may also be provided to at least one of the first roller 12 and the second roller 14 of the conveyor 30, and used, alone or in combination with fastening means 18, to hold the photosensitive printing element 16 in place on the continuous loop 31 of the conveyor 30.

During operation, the conveyor 30 with photosensitive printing element 16 moves in a first direction 33 towards heatable roller 36 such that the photosensitive printing element 16 passes through a gap 50 between the conveyor 30 and the heatable roller 36 as the continuous loop 31 of conveyor 30 rotates over and around the first roller 12. Heatable roller 36 rotates in an opposite direction 38 from the conveyor 30. Heatable roller 36 is capable of being urged towards the photosensitive printing element 16 positioned on the conveyor 30 as the conveyor moves in first direction 33 and heatable roller 36 moves in an opposite direction 38. Preferably, the heatable roller 36 is fixably mounted on a pivot (not shown), which allows it to be urged towards the conveyor 30.

The heatable roller 36 is typically urged toward the photosensitive printing element 16 on the conveyor 30 using suitable means, such as one or more pneumatic cylinders 55. The pneumatic cylinder(s) 55 positions the heatable roller 36 at a preset distance from the outer surface of the first roller 12 of the conveyor 30 to produce the gap 50 through which the photosensitive printing element 16 passes as it travels on the continuous loop 31 of the conveyor 30 around the first roller 12.

A web of absorbent material 24 is supplied over at least a portion of an outer surface 34 of the heatable roller 36. The web of absorbent material 24 is capable of absorbing (removing) material that is liquefied or softened from the photosensitive printing element 16 when the heatable roller 36 rotates and is heated and the web of absorbent material 24 contacts at least a portion of the photosensitive printing element 16. The heatable roller 36 rotates in a direction 38 opposite to the direction 33 of the conveyor 30 so that the photosensitive printing element 16 and the web of absorbent material 24 can be contacted with each other and then separated.

The pneumatic cylinder 55 is controlled to adjust the gap 50 depending on the thickness of the photosensitive printing element 16. The pneumatic cylinder(s) 55 causes photosensitive printing element 16 and the web of absorbent material 24 to come into contact at the gap 50 between the conveyor 30 and the heatable roller 36 as the conveyor 30 rotates in a first direction 33 and the heatable roller 36 rotates in an opposite direction 38 such that at least a portion of the liquefied or softened material is absorbed by the web of absorbent material 24.

Heat may be provided to the heatable roller 36 by a core heater that is capable of maintaining a skin temperature of the heatable roller 36 that will soften or liquefy at least a portion of the photosensitive material. The temperature to which the heatable roller 36 is heated is chosen based on the composition of the photosensitive material and is based on the melting temperature of the monomers and polymers contained within the photosensitive material. While the heatable roller 36 preferably comprises an electrical core heater to provide the desired skin temperature, the use of steam, oil, hot air, and a variety of other heating sources may also provide the desired skin temperature.

The web of absorbent material 24 is supplied to at least the portion of the outer surface of the heatable roller 36 from a supply roll 26 of the web of absorbent material 24. The selection of the absorbent material 24 depends in part upon the thickness of the photosensitive printing element 16 to be processed, the melting temperature of the web of absorbent material 24, and the heat transfer characteristics of both the photosensitive printing element 16 and the web of absorbent material 24.

The web of absorbent material 24 comes into face-to-face contact with the heatable roller 36, which may be heated to and operated at a temperature within the range of about 100° C. to about 250° C., more preferably between about 120° C. and about 200° C. The upper limit is determined in large part by the melting temperature of the web of absorbent material 24. The temperature of the heatable roller 36 must also be low enough so that when the web of absorbent material 24 is not moving and the portions of the web of absorbent material 24 contacting the heatable roller 36 are at rest, the absorbent material 24 does not melt. Suitable means for maintaining uniform tension in the web of absorbent material throughout the system may be used, including for example, one or more idler rollers (not shown). Other means for maintaining tension in the web may also be provided and would be known to those skilled in the art.

It is also critical that the linear speed of the heatable roller 36, the web of absorbent material 24, and the photosensitive printing element 16 be substantially the same to avoid any shear stress on the photosensitive printing element 16, which stress is known to cause uneven relief portion plate thickness.

A take-up roller 30 may be provided to wind the web of absorbent material 24 after processing through the thermal development apparatus. If present, the take-up roller 30 is independently belt driven by a motor 28, which is preferably a variable speed motor. The take-up roller 30 collects the web of absorbent material 24 after it has contacted the photosensitive printing element 16 and removed portions of the photosensitive material that were liquefied or softened. The speed of the motor 28 is adjusted so as to not interfere with the selected web tension. If the motor interferes with web tension, the resulting flexographic plate could potentially have variable heights in the relief portions or might warp and be commercially unacceptable.

The system 10 may also include external heating means 22 positioned adjacent to a point 50 where the web of absorbent material 24 contacts the photosensitive printing element 16 on the conveyor 30. The external heating means 22 provide a heat source to further soften and liquefy portions of one or layers of the photosensitive printing element 16 immediately prior to the point where the web of absorbent material 24 is brought into contact with the photosensitive printing element 16.

The conveyor 30, including first roller 12 and second roller 14 as well as the heatable roller 36 are driven by suitable means, i.e., a motor. In addition, a controller, such as a microprocessor, may be used to control the operation of each of the elements in the thermal development apparatus 10. Such controllers are well known in the art. One example of a controller used to control the various elements in a plate processor is described in U.S. Pat. No. 5,279,697 to Peterson et al., the subject matter of which is herein incorporated by reference in its entirety.

In addition, a rotating drum (not shown) may be used in place of conveyor 30 to bring the photosensitive printing element 16 into contact with the web of absorbent material at the nip 50. Thus, while the present invention is described with respect to conveyor 30, a rotating drum can be used in place of the conveyor if desired and, if used, would produce a similar result.

The thermal development apparatus 10 may also have ventilation means (not shown) connected to the enclosure 20 as described, for example, in U.S. Pat. No. 7,044,055 to Gotsick et al., the subject matter of which is herein incorporated by reference in its entirety. These means are operative in removing volatile organic compounds and other contaminants from the enclosure 20 for subsequent treatment and disposal.

The inventors of the present invention have also discovered that improved temperature control of the photosensitive printing element 16 itself, rather than simply setting a temperature of a heating element or other part of the apparatus, can provide a more consistent relief image printing plate product. In other words, a more consistent control of the temperature of the photosensitive relief image printing element being processed and especially a more consistent control of the temperature of the photosensitive relief image printing element, to regulate the temperature that more closely monitors the heating roll, can reduce the risk of machine processing issues and increase the quality of the resulting photosensitive relief image printing element 16.

The inventors of the present invention have discovered that when the photosensitive printing element 16 is at a temperature that is much lower than the temperature at the point at which the heatable roller 36 is brought into contact with the photosensitive printing element 16 at the nip 50, the temperature variance can lead to plate quality issues with the surface of the printing plate and processing issues within the thermal development apparatus 10. Thus, raising the temperature of the photosensitive printing element 16 to a temperature that approaches the operating temperature of the heatable roller 36 can result in an improved product.

As described herein, a heating zone is generally created within photosensitive printing element 16. When the surface of the photosensitive printing element 16 is maintained at a colder temperature than the heatable roller 16 at the processing nip 50, this temperature variance can lead to plate quality issues with the surface of the photosensitive printing element 16 and processing issues in the thermal development apparatus 10.

As described above, temperature control has generally been handled using a main heating source, which generally comprises the heatable roller 36, and may include a secondary heat source (i.e., external heating means 22) which generally constitutes an infrared lamp positioned directly in front of the processing nip 50.

The inventors of the present invention have found that processing of the photosensitive printing element 16 in the thermal development apparatus 10 can be further optimized to achieve better stability and better plate quality.

The photosensitive printing element 16 generally includes one or more layer of photosensitive material on a flexible substrate, which may comprise a low melt polyester such as polyethylene terephthalate, polyethylene naphthalate, or another suitable material. The one or more layers of photosensitive material include cured portions of photosensitive material and uncured portions of photosensitive material, and the uncured portions are capable of being softened and removed using the thermal development apparatus described herein.

Figure 2:
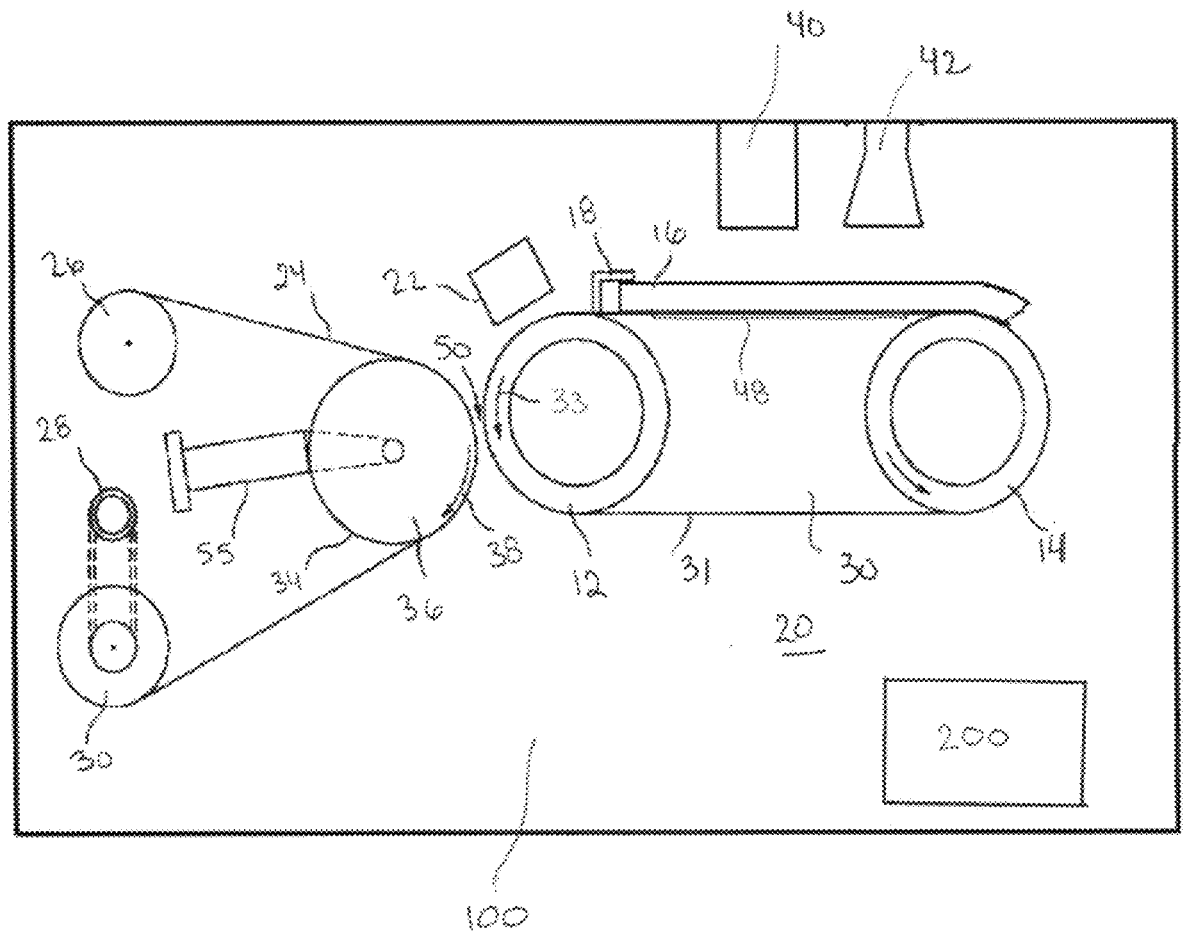
FIG. 2 depicts a thermal development apparatus in accordance with another aspect of the present invention.

FIG. 2 depicts thermal development apparatus 100 that has been found to produce a more consistent photosensitive relief image printing element in terms of quality and stability.

Thermal development apparatus 100 comprises:

(a) an enclosure 20;

(b) conveying means 30 upon which the photosensitive printing element 16 is securable, wherein the conveying means 30 comprises a conveyor supported by at least a first roller 12 and a second roller 14, wherein the first roller 12 is arranged adjacent to a position 50 at which the photosensitive printing element 16 is brought into contact with a web of absorbent material 24 and the second roller 14 is positioned at a distance from the first roller 12;

(c) a heatable roller 36 mounted in the enclosure 20, wherein the heatable roller 36 is heated to and maintained at an operating temperature at which the uncured portions of photosensitive material begins to liquefy or soften;

(d) an absorbent material 24 covering at least a portion of the heatable roller 36, wherein the absorbent material 24 is capable of absorbing liquefied or softened uncured portions of photosensitive material from the photosensitive printing element 16 when the photosensitive printing element 16 comes into contact with the absorbent material 24 on the portion of the heatable roller 36; and (e) an auxiliary heating zone arranged relative to the conveying means, wherein the auxiliary heating zone is configured to heat the photosensitive printing element from a first temperature at a location at which the photosensitive printing element enters or re-enters the thermal development apparatus to the operating temperature of the heatable roller.

As discussed above, the conveying means may comprise, for example, a conveyor 30, or alternatively, a rotatable drum (not shown) and the photosensitive printing element 16 is secured to the conveying means for thermal processing in the thermal development apparatus 100. In one embodiment, the conveying means comprises a conveyor 30 attached to a drive motor (not shown) is used to transport and convey the photosensitive printing element 16 through the thermal development apparatus 100. The conveyor 30 is mounted in a fixed position in the enclosure 20, and comprises a continuous loop support means 31 supported by at least a first roller 12 and a second roller 14. Optionally, one or more additional rollers (not shown) may be used to provide additional support to the conveyor 30 and prevent the continuous loop 31 from sagging from the weight of the photosensitive printing element 16. The continuous loop support means 31 may comprise a wire mesh.

The auxiliary heating zone may comprise suitable means to raise the temperature of the relief image printing element 16 from a lower temperature that may be near ambient temperature to a temperature that approaches the operating temperature of the heatable roller 36.

In one embodiment, the auxiliary heating zone comprises one or more plate heaters 40 arranged in the enclosure 20 at a distance from the conveying means 30 to which the photosensitive printing element 16 is secured. The one or more plate heaters 40 are arranged to provide an adequate heating range, which may be at least about 40% or at least about 50% or at least about 60% depending on the type and intensity of the one or more plate heaters. The "heating range" refers to the amount of time the infrared heater is on, with 100% means that the infrared bulb is always on and 0% meaning that the bulb is never on.

The number of plate heaters 40 being used may depend in part on the size of the thermal development apparatus 100, the wavelength and/or intensity of each plate heater 40, and the type of plate material being processed.

In one embodiment, the one or more plate heaters 40 comprise infrared heaters. Infrared heaters generally operate at wavelengths between about 700 nm to about 1,000 μm. Generally, the shorter the wavelength, the higher the temperature of the heater. Because the energy is directly transferred from the heater to the target object, infrared heating systems can be more efficient and require less energy for similar results. Infrared heaters are electrically powered, allowing for controls that respond rapidly and precisely, which creates a more uniform output and product quality.

Infrared A, also referred to as "short-wave" or "near" infrared, operates at wavelengths within the range of about 700 mm to 1,400 nm and temperatures up to about 2,700° C. Infrared B, also referred to as "medium-wave" or "medium" infrared, operates at wavelengths within the range of 1,400 nm to about 3,000 nm and at temperatures within the range of about 500 to about 800° C. Infrared C, also referred to as "long-wave" or "far infrared" operates at wavelengths about 3,000 nm and at temperatures that are generally less than about 500° C. In one embodiment, the one or more plate heaters 40 are medium-wave infrared heaters that are optimized to provide heat at a temperature that can bring the photosensitive printing element 16 up to the desired temperature. While it is contemplated that short-wave or long-wave infrared heaters may also be used, depending on the temperature and intensity of the heaters, medium-wave infrared heaters are generally preferred.

In another embodiment, the one or more plate heaters 40 comprise a plurality of infrared heaters operating at different wavelengths or different intensities. For example, the plurality of plate heaters 40 may operate at different wavelengths within the medium-wave wavelength range or may operate different intensities. While various operating wavelengths and various intensities can be utilized, what is desirable is that the temperature of at least a portion of the depth of the photosensitive printing element is gradually increased, preferably wherein the temperature of the one or more photosensitive layers is increased such that the entire depth of the uncured photosensitive material is affected. On the other hand, it is also desired that the temperature of the substrate or backing layer of the photosensitive printing element be maintained at a temperature that is low enough to prevent warping or damage to the substrate or backing layer as described in more detail below.

In one embodiment, the one or more plate heaters 40 are used in sequence, meaning that one or more of the one or more plate heaters 40 may be operated at a first wavelength and/or a first intensity, followed by the operation of the remaining one or more plate heaters 40 being operated at a different wavelength and/or a different intensity. Alternatively, one or more plate heaters 40 of a different wavelength and/or a different intensity are used simultaneously.

In one embodiment, the one or more plate heaters 40 are arranged at a distance from the conveying means 30 to which the photosensitive printing element 16 is attached of between about 0.5 and about 6 inches, more preferably about 1 to about 4 inches. In another embodiment, the one or more plate heaters 40 are arranged on a movable horizontal rail (not shown) which may allow the one or more plate heaters 40 to traverse across the width of the relief image printing element 16. In one embodiment, the one or more plate heaters are arranged on a movable vertical rail (not shown) to adjust the distance of the one or more plate heaters 40 from the conveying means 30. In still another embodiment, the one or more plate heaters 40 may be arranged in a rail system that includes both vertical movement and horizontal movement so as to allow the one or more plate heaters 40 to traverse across the width of the relief image printing element 16 and/or to adjust the distance of the one or more plate heaters 40 to allow greater control of the position of the one or more plate heaters as well as their intensity.

The rail system may also be connected to control system 200 to provide on-the-fly adjustments of the plate heaters 40 as necessary, depending in part on the formulation of the photosensitive printing element, thickness of the photosensitive printing element, complexing of the relief image being developed, and other features that may affect the development of the photosensitive printing element 16.

In one embodiment, control system 200, which includes a processor or microprocessor and which also includes one or more sensors, is coupled to the various elements that make up the thermal development apparatus 100, including the one or more plate heaters 40 and/or the rail system to which the one or more plate heaters 40 are attached. In one embodiment, control system 200 is connected to one or more temperature sensors for monitoring the temperature of the photosensitive printing element 16 at various locations within the apparatus 100.

The one or more temperature sensors may monitor the temperature of the photosensitive printing element 16 from a point at which the photosensitive printing element 16 enters and/or reenters the thermal development apparatus 100 until the relief image printing element 16 passes into the thermal development apparatus 100 and approaches the nip 50 where the relief image printing element 16 comes into contact with the web of absorbent material 24 arranged over a portion of the heatable roller 36. The one or more temperature sensors monitor the increase in temperature of the photosensitive printing element 16 as the photosensitive printing element 16 moves on the continuous loop 31 of the conveyor 30 towards the point 50 where the absorbent material 24 arranged over the portion of the heatable roller 36 contacts the photosensitive printing element 16. In one embodiment, the one or more plate heaters 40 contact the photosensitive printing element 16 from the point at which the photosensitive printing element 16 enters and/or reenters the thermal development apparatus 100 up to a point that is about 6 to about 10 inches from the nip 50, more preferably about 6 to about 8 inches from the nip 50.

The temperature of the photosensitive printing element 16 at a point where the photosensitive printing element 16 enters or re-enters the thermal development apparatus 16 may be below 50° C. or below 40° C. or below 30° C. or at about room temperature and may increase to a temperature of greater than 100° C. or greater than 110° C. or greater than 120° C. or greater than 130° C. or greater than 150° C. or great than 160° C. at a point where the photosensitive printing element 16 approaches the first roller 12 of the conveyor 30 and then enters the nip 50 where the relief image printing element 16 comes into contact with the web of absorbent material 24 arranged over a portion of the heatable roller 36.

Thermal development apparatus 100 may also include external heating means 22 positioned adjacent to a point 50 where the web of absorbent material 24 contacts the photosensitive printing element 16 on the conveyor 30. The external heating means 22 provides an additional heat source to further soften and liquefy portions of one or layers of the photosensitive printing element 16 immediately prior to the point where the web of absorbent material 24 is brought into contact with the photosensitive printing element 16 and after the one or more plate heaters 42 have raised the temperature of the photosensitive printing element 16.

The inventors of the present invention have also determined that it may be desirable to at least substantially simultaneously cool the backside of the photosensitive printing element 16. In other words, heating the photosensitive printing element 16 to a temperature that approaches the operating temperature of heatable roller 36 (i.e., a temperature of greater than 100° C.) may have a negative impact on the substrate or backing layer which may be made of a low melt polyester such as polyethylene terephthalate. Therefore, in order to maintain temperature of the substrate or backing layer at a temperature below its melt temperature, a cooling system 48 may be utilized on an interior of the conveyor 30 to cool the backside of the photosensitive printing element 16. In one embodiment, the cooling system 48 may constitute one or more thermoelectric coolers arranged adjacent to the continuous loop 31 of the conveyor to cool the backside of the photosensitive printing element 16 while the photosensitive printing element 16 is being processed in the thermal development apparatus 100.

In one embodiment, the auxiliary heating zone comprises one or more blowers 42. The one or more blowers 42 may be used in addition to (or in place of) the one or more plate heaters 40. The one or more blowers 42 may be connected to the rail system or the one or more plate heaters 40 and to direct heated air toward the surface of the photosensitive printing element 16. The one or more blowers 42 can be mounted in any orientation or completely around the conveying means 30.

In one embodiment, heated blowers 42 can be used to control the temperature of the photosensitive printing 16 via hot air emitting from the one or more blowers 42 and the heated blowers 42 can be used in place of the one or more plate heaters 40. A similar result is achieved in heating up the plate temperature before nip 50. In addition, it is also contemplated that heated blowers can be used at other locations in the thermal development apparatus 100 to maintain the temperature of the photosensitive printing element 16 at a desired level.

In another embodiment, the present invention also related generally to a method of thermally developing a photopolymer relief image printing element, wherein the photosensitive printing element comprises a flexible substrate and at least one layer of photosensitive material comprising cured portions of photosensitive material and uncured portions of photosensitive material on the flexible substrate, the method comprising the steps of:

a. securing a photosensitive printing element to a conveying means, wherein the conveying means comprises a conveyor supported by at least a first roller and a second roller, wherein the first roller is adjacent to a position at which the photosensitive printing element is brought into contact with a web of absorbent material and the second roller is positioned at a distance from the first roller;

b. heating the photosensitive printing from a first temperature to an operating temperature of a heatable roller in an auxiliary heating zone, wherein the auxiliary heating zone is configured to heat the photosensitive printing element from a first temperature to the operating temperature of the heatable roller, and wherein the operating temperature of the heatable roller is a temperature sufficient to cause at least a portion of the photosensitive printing element to soften or liquefy when an absorbent material is brought into contact with the at least one layer of photosensitive material;

c. supplying an absorbent material to at least a portion of an outer surface of the heatable roller, said heatable roller being mounted for rotation in the frame, wherein the absorbent material is capable of absorbing material that is liquefied or softened from the photosensitive printing element when the heatable roller is heated and the absorbent material contacts at least a portion of the photosensitive printing element;

d. causing the photosensitive material and the absorbent printing element to come into contact at a point between the conveyor and the heatable roller such that at least a portion of the liquefied or softened material is absorbed by the absorbent material.

The present invention will not be described with regards to the following non-limiting examples:

Comparative Example 1

A photosensitive printing element (Digital MAX, available from MacDermid Graphics Solutions, LLC) having a thickness of 0.045 inches was processed in a LAVA® 4260 thermal development apparatus (available from MacDermid Graphics Solutions, LLC). Both 5% dots and 30% dots were processed.

Figures 3, 4, 5:
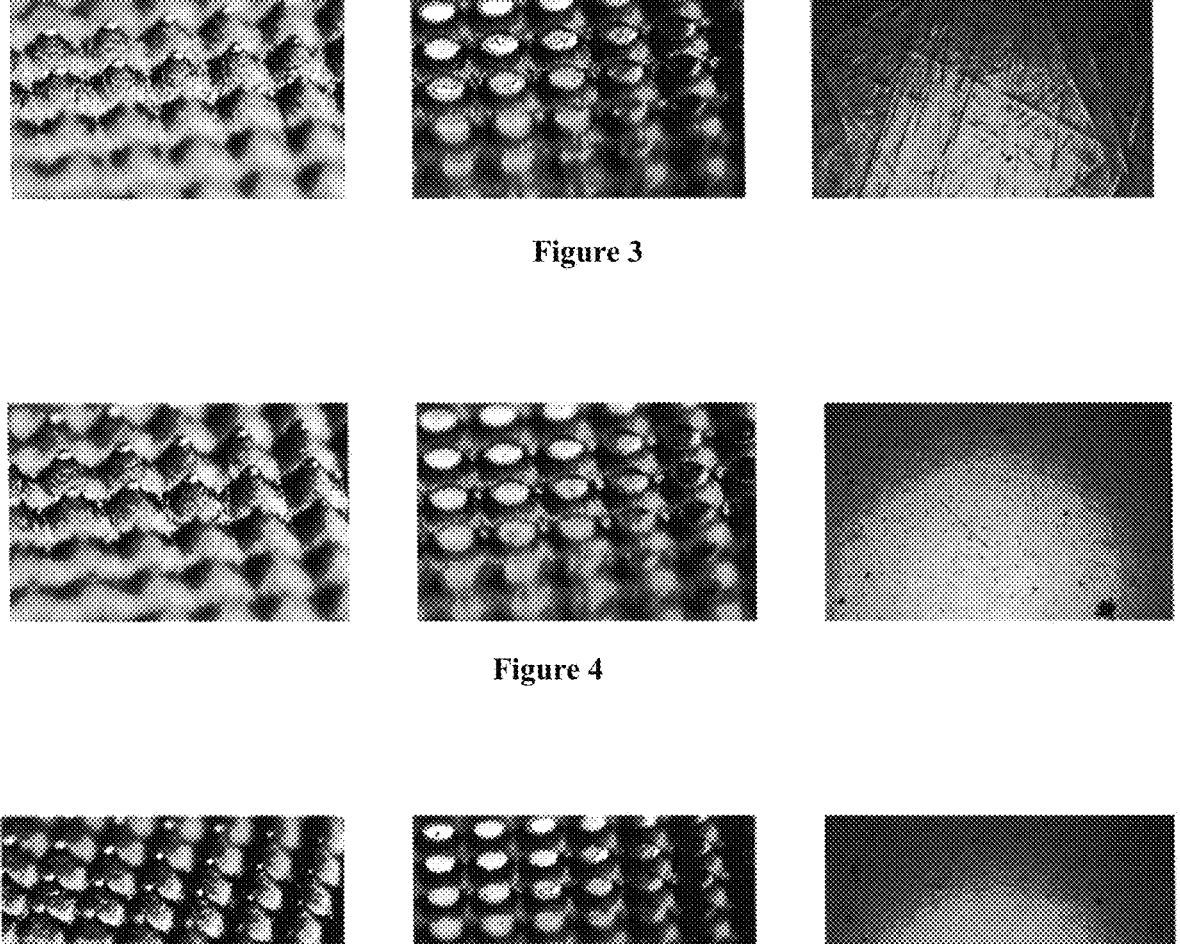
FIG. 3 depicts a view of the dot shape of 5% dots and 30% dots and the surface image of a photosensitive printing element processed in accordance with Comparative Example 1.
FIG. 4 depicts a view of the dot shape of 5% dots and 30% dots and the surface image of a photosensitive printing element processed in accordance with Example 2.
FIG. 5 depicts a view of the dot shape of 5% dots and 30% dots and the surface image of a photosensitive printing element processed in accordance with Example 3.

FIG. 3 depicts the shape of the dots after thermal development and the surface of the image. As shown in FIG. 3, the surface of the printed dots exhibited significant roughness.

Example 2

A photosensitive printing element (Digital MAX, available from MacDermid Graphics Solutions, LLC) having a thickness of 0.045 inches was processed.

A LAVA® 4260 thermal development apparatus (available from MacDermid Graphics Solutions, LLC) was modified to remove the filter box containing cooling blowers. Infrared lamps were added and the temperature of the infrared lamps was set to regulate at 135° C. plate temperature. The infrared heater was set at a distance of 3 inches from the surface of the printing element.

The infrared heater housing was mounted in the unit with a voltage regulator to test different voltages for performance and different infrared wavelengths.

The conveyor moved at a speed of about 5 FPM and the operating temperature of the heatable roller was 135° C. Both 5% dots and 30% dots were processed.

FIG. 4 depicts the shape of the dots after thermal development and the surface of the image. As shown in FIG. 4, the surface of the printed dots exhibited less surface roughness than the plate of Comparative Example 1.

Example 3

A photosensitive printing element (Digital MAX, available from MacDermid Graphics Solutions, LLC) having a thickness of 0.045 inches was processed in a LAVAR 4260 thermal development apparatus (available from MacDermid Graphics Solutions, LLC).

The filter box was added back onto the thermal development apparatus to provide cooling blowers to cool plate temperatures between multiple passes through the thermal development apparatus to prevent relief image printing elements from being overheated. Both 5% dots and 30% dots were processed.

The conveyor moved at a speed of about 5 FPM and the operating temperature of the heatable roller was 135° C. The photosensitive printing element was preheated using an infrared plate heater so that the heating range of the infrared heater was about 60%. As discussed above, the "heating range" refers to the amount of time the infrared heater is on, with 100% means that the infrared bulb is always on and 0% meaning that the bulb is never on. A blower was used to direct heated air towards the surface of the photosensitive printing element.

FIG. 5 depicts the shape of the dots after thermal development. As shown in FIG. 5, the surface of the printing dots was more uniform and exhibited very little surface roughness.

It can be seen from the examples that the use of infrared plate heaters and/or blowers in a thermal development apparatus can improve the quality of the printing dots and reduce the surface roughness of the printing surface.

Figure 6:
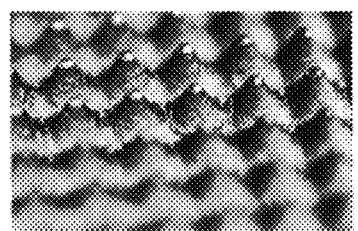
FIG. 6 depicts a comparison of the view of the dot shape of 5% dots processed in accordance with Comparative Example 1, Example 2, and Example 3.
Figure 6:
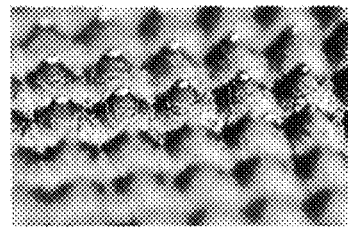
Figure 6:
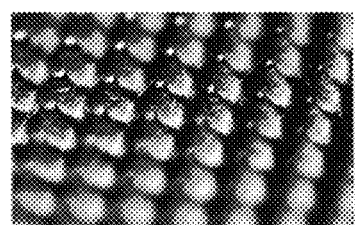

FIG. 6 depicts a comparison of the 5% dots of Comparative Example 1, Example 2, and Example 3. As shown in FIG. 6, the 5% dots of Examples 2 and 3 exhibited greater uniformity with lower surface roughness.

Figure 7:
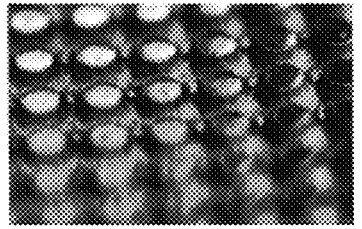
FIG. 7 depicts a comparison of the view of the dot shape of 30% dots processed in accordance with Comparative Example 1, Example 2, and Example 3.
Figure 7:
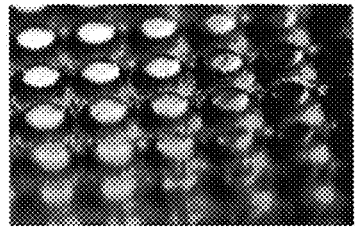
Figure 7:
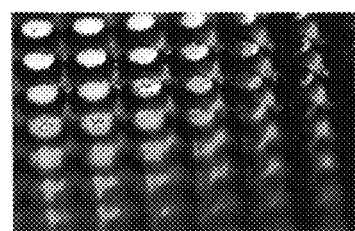

FIG. 7 depicts a comparison of the 30% dots of Comparative Example 1, Example 2, and Example 3. As shown in FIG. 7, the 30% dots of Examples 2 and 3 greater uniformity with lower surface roughness.

Figure 8:
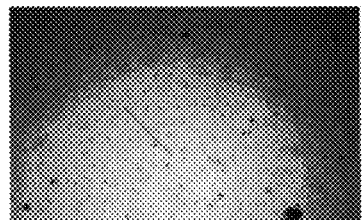
FIG. 8 depicts a comparison of the surface image of the photosensitive printing elements processed in accordance with Comparative Example 1, Example 2 and Example 3.
Figure 8:
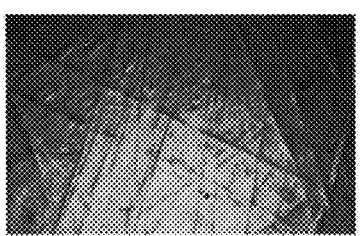
Figure 8:
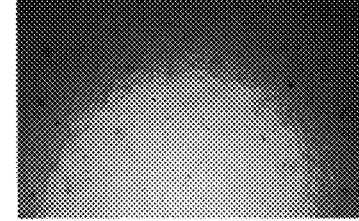

FIG. 8 depicts a comparison of the surface roughness of the printing dots of Comparative Example 1, Example 2, and Example 3. As shown in FIG. 8, Examples 2 and 3 produced dots with minimal surface roughness and an optimal result.

ADDITIONAL EMBODIMENTS

Clause 1: A thermal development apparatus for forming a relief structure on a photosensitive printing element, wherein the photosensitive printing element comprises a flexible substrate and at least one layer of photosensitive material comprising cured portions of photosensitive material and uncured portions of photosensitive material on the flexible substrate, the apparatus comprising:

a) an enclosure;

b) conveying means upon which the photosensitive printing element is securable, wherein the conveying means comprises a conveyor supported by at least a first roller and a second roller, wherein the first roller is arranged adjacent to a position at which the photosensitive printing element is brought into contact with a web of absorbent material and the second roller is positioned at a distance from the first roller;

c) a heatable roller mounted in the enclosure, wherein the heatable roller is heated to and maintained at an operating temperature at which the uncured portions of photosensitive material begins to liquefy or soften;

d) an absorbent material covering at least a portion of the heatable roller, wherein the absorbent material is capable of absorbing liquefied or softened uncured portions of photosensitive material from the photosensitive printing element when the photosensitive printing element comes into contact with the absorbent material on the portion of the heatable roller; and e) an auxiliary heating zone arranged relative to the conveying means, wherein the auxiliary heating zone is configured to heat the photosensitive printing element from a first temperature at a location at which the photosensitive printing element enters or re-enters the thermal development apparatus to the operating temperature of the heatable roller.

Clause 2: The thermal development apparatus according to Clause 1, wherein the convection heating zone comprises one or more plate heaters and or blowers mounted relative to the conveying means, optionally wherein the one or more plate heaters are infrared heaters.

Clause 3: The apparatus according to Clause 2, wherein the one or more infrared plate heaters are positioned at a distance from a top surface of the photosensitive printing element.

Clause 4: The apparatus according to Clause 3, wherein distance from the top surface of the photosensitive printing element is adjustable, whereby the intensity of the one or more infrared plate heaters is controlled.

Clause 5: The apparatus according to any of Clauses 2 to 4, wherein the one or more plate heaters are arranged in a rail system that permits vertical movement and/or horizontal movement, wherein the one or more plate heaters traverse across the width of the relief image printing element and/or to adjust the distance or location of the one or more plate heaters relative to the surface of the photosensitive printing element.

Clause 6: The apparatus according to any of Clauses 2 to 5, wherein the one or more infrared plate heaters comprises at least two plate heaters, wherein the at least two plate heaters are used in series.

Clause 7: The apparatus according to Clause 6, wherein the at least two infrared plate heaters comprises infrared plate heaters that operate at different wavelength outputs.

Clause 8: The apparatus according to any of Clauses 1 to 7, comprising a control system coupled to the thermal development apparatus, wherein the control system comprises one or more temperature sensors.

Clause 9: The apparatus according to Clause 8, wherein at least some of the one or more temperature sensors measure a temperature of the photosensitive printing element.

Clause 10: The apparatus according to any of Clauses 1 to 9, comprising a cooling system positioned below the continuous loop of the conveying means, wherein the cooling system controls a temperature of the flexible substrate.

Clause 11: The apparatus according to Clause 10, wherein the cooling system comprises a thermoelectric cooler, wherein the thermoelectric cooler is connected to the control system.

Clause 12: The apparatus according to any of Clauses 1 to 11, further comprising blowers, wherein the blowers directed heated air towards a surface of the photosensitive printing element.

Clause 13: The apparatus according to any of Clauses 1 to 12, further comprising external heating means for applying heat to the photosensitive printing element on the conveying means, wherein said heating means are positioned adjacent to a point where the absorbent material contacts the photosensitive printing element on the conveying means.

Clause 14: A method of thermally developing a photopolymer relief image printing element, wherein the photosensitive printing element comprises a flexible substrate and at least one layer of photosensitive material comprising cured portions of photosensitive material and uncured portions of photosensitive material on the flexible substrate, the method comprising the steps of:

a. securing a photosensitive printing element to a conveying means, wherein the conveying means comprises a conveyor supported by at least a first roller and a second roller, wherein the first roller is adjacent to a position at which the photosensitive printing element is brought into contact with a web of absorbent material and the second roller is positioned at a distance from the first roller;

b. heating the photosensitive printing from a first temperature to an operating temperature of a heatable roller in a convection heating zone, where the convection heating zone is configured to heat the photosensitive printing element from a first temperature to the operating temperature of the heatable roller, and wherein the operating temperature of the heatable roller is a temperature sufficient to cause at least a portion of the photosensitive printing element to soften or liquefy when an absorbent material is brought into contact with the at least one layer of photosensitive material;

c. supplying an absorbent material to at least a portion of an outer surface of the heatable roller, said heatable roller being mounted for rotation in the frame, wherein the absorbent material is capable of absorbing material that is liquefied or softened from the photosensitive printing element when the heatable roller is heated and the absorbent material contacts at least a portion of the photosensitive printing element; and d. causing the photosensitive material and the absorbent printing element to come into contact at a point between the conveyor and the heatable roller such that at least a portion of the liquefied or softened material is absorbed by the absorbent material.

Clause 15: The method according to Clause 14, wherein the first temperature is less than about 50° C. and the operating temperature is greater than about 100° C.

Clause 16: The method according to Clause 14, further comprising the step of applying heat to the photosensitive printing element on the conveyor from an external heater positioned adjacent to a point where the absorbent material contacts the photosensitive printing element on the conveyor.

Clause 17: The method according to any of Clauses 14 to 16, wherein the auxiliary zone comprises one or more plate heaters and/or one or more blowers.

Clause 18: The method according to Clause 17, wherein the one or more plate heaters and/or blowers are arranged in a rail system that permits vertical movement and/or horizontal movement, the method further comprising the step of traversing the one or more plate heaters and/or blowers across the width of the relief image printing element and/or adjusting a distance or a location of the one or more plate heaters and/or blowers relative to the surface of the photosensitive printing element.

Clause 19: The method according to any of Clauses 15 to 18, comprising the step of controlling a temperature of the flexible substrate, wherein a cooling system is positioned below the continuous loop of the conveying means to cool the backside of the photosensitive printing element.

Clause 20: The method according to Clause 19, wherein the cooling system comprises a thermoelectric cooler, wherein the thermoelectric cooler is connected to the control system.

What is claimed is:

1. A thermal development apparatus for forming a relief structure on a photosensitive printing element, wherein the photosensitive printing element comprises a flexible substrate and at least one layer of photosensitive material comprising cured portions of photosensitive material and uncured portions of photosensitive material on the flexible substrate, the apparatus comprising:

a) an enclosure;

b) conveying means upon which the photosensitive printing element is securable, wherein the conveying means comprises a conveyor supported by at least a first roller and a second roller, wherein the first roller is arranged adjacent to a position at which the photosensitive printing element is brought into contact with a web of absorbent material and the second roller is positioned at a distance from the first roller;

c) a heatable roller mounted in the enclosure, wherein the heatable roller is heated to and maintained at an operating temperature at which the uncured portions of photosensitive material begins to liquefy or soften;

d) an absorbent material covering at least a portion of the heatable roller, wherein the absorbent material is capable of absorbing liquefied or softened uncured portions of photosensitive material from the photosensitive printing element when the photosensitive printing element comes into contact with the absorbent material on the portion of the heatable roller;

e) an auxiliary heating zone arranged relative to the conveying means, wherein the auxiliary heating zone is configured to heat the photosensitive printing element from a first temperature at a location at which the photosensitive printing element enters or re-enters the thermal development apparatus to the operating temperature of the heatable roller; and f) an external heating means for applying heat to the photosensitive printing element on the conveying means.

2. The thermal development apparatus according to claim 1, wherein the auxiliary heating zone comprises one or more plate heaters and or blowers mounted relative to the conveying means.

3. The apparatus according to claim 2, wherein the one or more plate heaters are infrared heaters.

4. The apparatus according to claim 2, wherein the one or more plate heaters are positioned at a distance from a top surface of the photosensitive printing element.

5. The apparatus according to claim 4, wherein the distance from the top surface of the photosensitive printing element is adjustable, whereby the intensity of the one or more plate heaters is controlled.

6. The apparatus according to claim 2, wherein the one or more plate heaters are arranged in a rail system that permits vertical movement and/or horizontal movement, wherein the one or more plate heaters traverse across the width of the photosensitive printing element and/or to adjust the distance or location of the one or more plate heaters relative to the surface of the photosensitive printing element.

7. The apparatus according to claim 3, wherein the one or more plate heaters comprise at least two plate heaters, wherein the at least two plate heaters are used in series.

8. The apparatus according to claim 7, wherein the at least two plate heaters comprise infrared plate heaters that operate at different wavelength outputs.

9. The apparatus according to claim 1, comprising a control system coupled to the thermal development apparatus, wherein the control system comprises one or more temperature sensors.

10. The apparatus according to claim 9, wherein at least one of the one or more temperature sensors measure a temperature of the photosensitive printing element.

11. The apparatus according to claim 1, comprising a cooling system positioned below the continuous loop of the conveying means, wherein the cooling system controls a temperature of the flexible substrate.

12. The apparatus according to claim 11, wherein the cooling system comprises a thermoelectric cooler, wherein the thermoelectric cooler is connected to the control system.

13. The apparatus according to claim 1, further comprising blowers, wherein the blowers directed heated air towards a surface of the photosensitive printing element.

14. The apparatus according to claim 1, wherein said heating means are positioned adjacent to a point where the absorbent material contacts the photosensitive printing element on the conveying means.

15. A method of thermally developing a photopolymer relief image printing element, wherein the photosensitive printing element comprises a flexible substrate and at least one layer of photosensitive material comprising cured portions of photosensitive material and uncured portions of photosensitive material on the flexible substrate, the method comprising the steps of:

a. securing a photosensitive printing element to a conveying means, wherein the conveying means comprises a conveyor supported by at least a first roller and a second roller, wherein the first roller is adjacent to a position at which the photosensitive printing element is brought into contact with a web of absorbent material and the second roller is positioned at a distance from the first roller;

b. heating the photosensitive printing element from a first temperature to an operating temperature of a heatable roller in an auxiliary heating zone, where the auxiliary heating zone is configured to heat the photosensitive printing element from a first temperature to the operating temperature of the heatable roller, and wherein the operating temperature of the heatable roller is a temperature sufficient to cause at least a portion of the photosensitive printing element to soften or liquefy when an absorbent material is brought into contact with the at least one layer of photosensitive material;

c. applying heat to the photosensitive printing element on the conveyor from an external heater positioned adjacent to a point where the absorbent material contacts the photosensitive printing element on the conveyor;

d. supplying an absorbent material to at least a portion of an outer surface of the heatable roller, said heatable roller being mounted for rotation in the frame, wherein the absorbent material is capable of absorbing material that is liquefied or softened from the photosensitive printing element when the heatable roller is heated and the absorbent material contacts at least a portion of the photosensitive printing element; and e. causing the photosensitive material and the absorbent printing element to come into contact at a point between the conveyor and the heatable roller such that at least a portion of the liquefied or softened material is absorbed by the absorbent material.

16. The method according to claim 15, wherein the first temperature is less than about 50° C. and the operating temperature is greater than about 100° C.

17. The method according to claim 15, wherein the auxiliary heating zone comprises one or more plate heaters and/or one or more blowers.

18. The method according to claim 17, wherein the one or more plate heaters and/or blowers are arranged in a rail system that permits vertical movement and/or horizontal movement, the method further comprising the step of traversing the one or more plate heaters and/or blowers across the width of the relief image printing element and/or adjusting a distance or a location of the one or more plate heaters and/or blowers relative to the surface of the photosensitive printing element.

19. The method according to claim 15, further comprising a step of controlling a temperature of the flexible substrate, wherein a cooling system is positioned below the continuous loop of the conveying means to cool the backside of the photosensitive printing element.

20. The method according to claim 19, wherein the cooling system comprises a thermoelectric cooler, wherein the thermoelectric cooler is connected to the control system.

21. A thermal development apparatus for forming a relief structure on a photosensitive printing element, wherein the photosensitive printing element comprises a flexible substrate and at least one layer of photosensitive material comprising cured portions of photosensitive material and uncured portions of photosensitive material on the flexible substrate, the apparatus comprising:

a. an enclosure;

b. conveying means upon which the photosensitive printing element is securable, wherein the conveying means comprises a conveyor supported by at least a first roller and a second roller, wherein the first roller is arranged adjacent to a position at which the photosensitive printing element is brought into contact with a web of absorbent material and the second roller is positioned at a distance from the first roller;

c. a heatable roller mounted in the enclosure, wherein the heatable roller is heated to and maintained at an operating temperature at which the uncured portions of photosensitive material begins to liquefy or soften;

d. an absorbent material covering at least a portion of the heatable roller, wherein the absorbent material is capable of absorbing liquefied or softened uncured portions of photosensitive material from the photosensitive printing element when the photosensitive printing element comes into contact with the absorbent material on the portion of the heatable roller;

e. an auxiliary heating zone arranged relative to the conveying means, wherein the auxiliary heating zone is configured to heat the photosensitive printing element from a first temperature at a location at which the photosensitive printing element enters or re-enters the thermal development apparatus to the operating temperature of the heatable roller; and f. a cooling system positioned below the continuous loop of the conveying means, wherein the cooling system controls a temperature of the flexible substrate.

\* \* \* \* \*